(12) United States Patent
Dane et al.

(10) Patent No.: US 9,924,609 B2
(45) Date of Patent: Mar. 20, 2018

(54) MODULAR PROTECTION CABINET WITH FLEXIBLE BACKPLANE

(71) Applicant: Transtector Systems, Inc., Hayden, ID (US)

(72) Inventors: Kelly A. Dane, Athol, ID (US); William K. Magee, Rathdrum, ID (US); Peter R. Bokma, Coeur d'Alene, ID (US)

(73) Assignee: Transtector Systems, Inc., Hayden, ID (US)

( * ) Notice: Subject to any disclaimer, the term of this patent is extended or adjusted under 35 U.S.C. 154(b) by 0 days.

(21) Appl. No.: 15/216,537

(22) Filed: Jul. 21, 2016

(65) Prior Publication Data

US 2017/0027068 A1    Jan. 26, 2017

Related U.S. Application Data

(60) Provisional application No. 62/196,837, filed on Jul. 24, 2015.

(51) Int. Cl.
    *H05K 7/14* (2006.01)
(52) U.S. Cl.
    CPC .................. *H05K 7/1458* (2013.01)
(58) Field of Classification Search
    CPC .............................. G06F 1/184; G06F 15/161
    See application file for complete search history.

(56) References Cited

U.S. PATENT DOCUMENTS

| | | | |
|---|---|---|---|
| 2,030,179 A | 2/1936 | Potter | |
| 2,857,558 A * | 10/1958 | Fiske | B65D 85/38 312/323 |
| 3,167,729 A | 1/1965 | Hall | |
| 3,323,083 A | 5/1967 | Ziegler | |
| 3,596,165 A | 7/1971 | Andrews | |
| 3,619,721 A | 11/1971 | Westendorp | |
| 3,662,225 A * | 5/1972 | Carter | H05K 7/16 361/727 |
| 3,663,901 A | 5/1972 | Forney, Jr. | |
| 3,731,234 A | 5/1973 | Collins | |
| 3,750,053 A | 7/1973 | LeDonne | |
| 3,783,178 A | 1/1974 | Philibert | |
| 3,831,110 A | 8/1974 | Eastman | |
| 3,832,627 A | 8/1974 | Ohsawa | |

(Continued)

FOREIGN PATENT DOCUMENTS

| | | |
|---|---|---|
| CH | 675933 | 11/1990 |
| JP | 08-066037 | 3/1996 |

(Continued)

*Primary Examiner* — Xanthia C Cunningham
(74) *Attorney, Agent, or Firm* — Snell & Wilmer LLP

(57) ABSTRACT

An enclosure having a rear base defining a cavity for holding one or more electronic devices. The enclosure includes a front cover coupled to the rear base and movable between an open position and a closed position. The enclosure includes a chassis mounted within the cavity of the rear base and a drawer chest having a multiple drawers within the cavity of the rear base. The drawer chest is connected to the chassis, and the multiple drawers are configured to receive the one or more electronic devices. The enclosure includes one or more connectors that are exposed outward and provide a connection to a host electronic device.

20 Claims, 16 Drawing Sheets

(56) References Cited

U.S. PATENT DOCUMENTS

| | | | |
|---|---|---|---|
| 3,845,358 A | 10/1974 | Anderson et al. | |
| 3,921,015 A | 11/1975 | Obeda et al. | |
| 3,944,937 A | 3/1976 | Fujisawa et al. | |
| 3,956,717 A | 5/1976 | Fisher et al. | |
| 3,980,976 A | 9/1976 | Tadama et al. | |
| 4,021,759 A | 5/1977 | Camp | |
| 4,046,451 A | 9/1977 | Juds et al. | |
| 4,047,120 A | 9/1977 | Lord et al. | |
| 4,112,395 A | 9/1978 | Seward | |
| 4,262,317 A | 4/1981 | Baumbach | |
| 4,287,764 A * | 9/1981 | Staab | G01D 11/24 361/714 |
| 4,356,360 A | 10/1982 | Volz | |
| 4,359,764 A | 11/1982 | Block | |
| 4,384,331 A | 5/1983 | Fukuhara et al. | |
| 4,409,637 A | 10/1983 | Block | |
| 4,481,641 A | 11/1984 | Gable et al. | |
| 4,554,608 A | 11/1985 | Block | |
| 4,563,720 A | 1/1986 | Clark | |
| 4,586,104 A | 4/1986 | Standler | |
| 4,679,121 A * | 7/1987 | Schomers | H05K 1/0228 361/729 |
| 4,689,713 A | 8/1987 | Hourtane et al. | |
| 4,698,721 A | 10/1987 | Warren | |
| 4,727,350 A | 2/1988 | Ohkubo | |
| 4,901,183 A | 2/1990 | Lee | |
| 4,952,173 A | 8/1990 | Peronnet et al. | |
| 4,984,146 A | 1/1991 | Black et al. | |
| 4,985,800 A | 1/1991 | Feldman et al. | |
| 5,053,910 A | 10/1991 | Goldstein | |
| 5,057,964 A | 10/1991 | Bender et al. | |
| 5,093,759 A * | 3/1992 | Davis | H05K 7/1411 361/721 |
| 5,102,818 A | 4/1992 | Paschke et al. | |
| 5,122,921 A | 6/1992 | Koss | |
| 5,124,873 A | 6/1992 | Wheeler | |
| 5,142,429 A | 8/1992 | Jaki | |
| 5,166,855 A | 11/1992 | Turner | |
| 5,170,151 A | 12/1992 | Hochstein | |
| 5,278,720 A | 1/1994 | Bird | |
| 5,321,573 A | 6/1994 | Persona et al. | |
| 5,325,270 A * | 6/1994 | Wenger | H05K 7/1441 361/796 |
| 5,353,189 A | 10/1994 | Tomlinson | |
| 5,412,526 A | 5/1995 | Kapp et al. | |
| 5,442,330 A | 8/1995 | Fuller et al. | |
| 5,534,768 A | 7/1996 | Chavannes et al. | |
| 5,537,044 A | 7/1996 | Stahl | |
| 5,584,396 A * | 12/1996 | Schmitt | H02B 1/36 211/26 |
| 5,611,224 A | 3/1997 | Weinerman et al. | |
| 5,617,284 A | 4/1997 | Paradise | |
| 5,625,521 A | 4/1997 | Luu | |
| 5,667,298 A | 9/1997 | Musil et al. | |
| 5,721,662 A | 2/1998 | Glaser et al. | |
| 5,781,844 A | 7/1998 | Spriester et al. | |
| 5,790,361 A | 8/1998 | Minch | |
| 5,844,766 A | 12/1998 | Miglioli | |
| 5,854,730 A | 12/1998 | Mitchell et al. | |
| 5,863,211 A * | 1/1999 | Sobotta | G06F 1/184 361/735 |
| 5,889,650 A * | 3/1999 | Bertilsson | H05K 7/16 361/610 |
| 5,943,225 A | 8/1999 | Park | |
| 5,953,195 A | 9/1999 | Pagliuca | |
| 5,959,839 A * | 9/1999 | Gates | G06F 1/20 257/719 |
| 5,963,407 A | 10/1999 | Fragapane et al. | |
| 5,966,283 A | 10/1999 | Glaser et al. | |
| 5,973,918 A * | 10/1999 | Felcman | G06F 1/184 361/679.6 |
| 5,982,602 A | 11/1999 | Tellas et al. | |
| 5,984,720 A * | 11/1999 | Milner | G02B 6/3897 439/534 |
| 5,986,869 A | 11/1999 | Akdag | |
| 6,026,458 A | 2/2000 | Rasums | |
| 6,031,705 A | 2/2000 | Gscheidle | |
| 6,054,905 A | 4/2000 | Gresko | |
| 6,060,182 A | 5/2000 | Tanaka et al. | |
| 6,061,223 A | 5/2000 | Jones et al. | |
| 6,076,906 A * | 6/2000 | Royal | A47B 46/00 312/223.1 |
| 6,086,544 A | 7/2000 | Hibner et al. | |
| 6,115,227 A | 9/2000 | Jones et al. | |
| 6,137,352 A | 10/2000 | Germann | |
| 6,141,194 A | 10/2000 | Maier | |
| 6,177,849 B1 | 1/2001 | Barsellotti et al. | |
| 6,195,493 B1 * | 2/2001 | Bridges | G02B 6/4452 385/134 |
| 6,226,166 B1 | 5/2001 | Gumley et al. | |
| 6,236,551 B1 | 5/2001 | Jones et al. | |
| 6,243,247 B1 | 6/2001 | Akdag et al. | |
| 6,252,755 B1 | 6/2001 | Willer | |
| 6,281,690 B1 | 8/2001 | Frey | |
| 6,285,563 B1 * | 9/2001 | Nelson | G11B 33/1413 174/254 |
| 6,292,344 B1 | 9/2001 | Glaser et al. | |
| 6,342,998 B1 | 1/2002 | Bencivenga et al. | |
| 6,381,283 B1 | 4/2002 | Bhardwaj et al. | |
| 6,385,030 B1 | 5/2002 | Beene | |
| 6,388,879 B1 * | 5/2002 | Otaguro | G02B 6/43 361/695 |
| 6,390,831 B2 * | 5/2002 | Shimada | H04Q 1/10 439/74 |
| 6,394,122 B1 | 5/2002 | Sibley et al. | |
| 6,421,220 B2 | 7/2002 | Kobsa | |
| 6,483,029 B1 * | 11/2002 | Lutz, Jr. | H04Q 1/116 174/50 |
| 6,502,599 B1 | 1/2003 | Sibley et al. | |
| 6,527,004 B1 | 3/2003 | Sibley et al. | |
| 6,535,369 B1 | 3/2003 | Redding et al. | |
| 6,721,155 B2 | 4/2004 | Ryman | |
| 6,754,060 B2 | 6/2004 | Kauffman | |
| 6,757,152 B2 | 6/2004 | Galvagni et al. | |
| 6,785,110 B2 | 8/2004 | Bartel et al. | |
| 6,789,560 B1 | 9/2004 | Sibley et al. | |
| 6,814,100 B1 | 11/2004 | Sibley et al. | |
| 6,816,348 B2 | 11/2004 | Chen et al. | |
| 6,940,730 B1 * | 9/2005 | Berg, Jr. | H04Q 1/10 174/383 |
| 6,968,852 B1 | 11/2005 | Sibley | |
| 6,975,496 B2 | 12/2005 | Jones et al. | |
| 7,075,796 B1 * | 7/2006 | Pritchett | G06F 1/184 211/41.17 |
| 7,082,022 B2 | 7/2006 | Bishop | |
| 7,104,282 B2 | 9/2006 | Hooker et al. | |
| 7,106,572 B1 | 9/2006 | Girard | |
| 7,130,103 B2 | 10/2006 | Murata | |
| 7,159,236 B2 | 1/2007 | Abe et al. | |
| 7,221,550 B2 | 5/2007 | Chang et al. | |
| 7,250,829 B2 | 7/2007 | Namura | |
| 7,352,576 B2 * | 4/2008 | McClure | G06F 1/20 361/610 |
| 7,430,103 B2 | 9/2008 | Kato | |
| 7,453,268 B2 | 11/2008 | Lin | |
| 7,471,172 B2 | 12/2008 | Holst et al. | |
| 7,507,105 B1 | 3/2009 | Peters et al. | |
| 7,623,332 B2 | 11/2009 | Frank et al. | |
| 7,675,726 B2 | 3/2010 | Bolz et al. | |
| 7,808,752 B2 | 10/2010 | Richiuso et al. | |
| 7,817,398 B1 | 10/2010 | Maples | |
| 8,081,422 B2 * | 12/2011 | Shannon | H05K 7/1457 307/43 |
| 8,112,873 B2 * | 2/2012 | Brolin | H05K 7/1459 29/601 |
| 8,458,958 B2 * | 6/2013 | Cress | E05F 5/02 16/374 |
| 2002/0167302 A1 | 11/2002 | Gallavan | |
| 2002/0191360 A1 | 12/2002 | Colombo et al. | |
| 2003/0072121 A1 | 4/2003 | Bartel et al. | |
| 2003/0151870 A1 | 8/2003 | Gronbach et al. | |

(56) References Cited

U.S. PATENT DOCUMENTS

| | | | |
|---|---|---|---|
| 2003/0161130 A1* | 8/2003 | Yamamoto | H05K 7/1454 |
| | | | 361/796 |
| 2003/0179533 A1 | 9/2003 | Jones et al. | |
| 2003/0211782 A1 | 11/2003 | Esparaz et al. | |
| 2004/0057224 A1* | 3/2004 | Kiko | H05K 1/181 |
| | | | 361/828 |
| 2004/0100751 A1 | 5/2004 | Ammann | |
| 2004/0121648 A1 | 6/2004 | Voros | |
| 2004/0145849 A1 | 7/2004 | Chang et al. | |
| 2004/0156179 A1* | 8/2004 | Hockett | G06F 1/181 |
| | | | 361/796 |
| 2004/0264087 A1 | 12/2004 | Bishop | |
| 2005/0030721 A1* | 2/2005 | Shimada | G06F 1/181 |
| | | | 361/726 |
| 2005/0036262 A1 | 2/2005 | Siebenthall et al. | |
| 2005/0044858 A1 | 3/2005 | Hooker et al. | |
| 2005/0176275 A1 | 8/2005 | Hoopes et al. | |
| 2005/0185354 A1 | 8/2005 | Hoopes | |
| 2005/0206482 A1 | 9/2005 | Du Toit et al. | |
| 2006/0044076 A1 | 3/2006 | Law | |
| 2006/0082946 A1 | 4/2006 | Duenez et al. | |
| 2006/0120005 A1 | 6/2006 | Van Sickle | |
| 2006/0139832 A1 | 6/2006 | Yates et al. | |
| 2006/0146458 A1 | 7/2006 | Mueller | |
| 2006/0171133 A1* | 8/2006 | Pedoeem | H05K 7/1458 |
| | | | 361/796 |
| 2007/0053130 A1 | 3/2007 | Harwath | |
| 2007/0139850 A1 | 6/2007 | Kamel et al. | |
| 2007/0202753 A1* | 8/2007 | Murakami | H01R 4/185 |
| | | | 439/701 |
| 2007/0232089 A1* | 10/2007 | Fung | H05K 1/14 |
| | | | 439/65 |
| 2008/0170346 A1 | 7/2008 | Van Swearingen | |
| 2008/0298035 A1* | 12/2008 | Kajio | H05K 1/0263 |
| | | | 361/784 |
| 2009/0103226 A1 | 4/2009 | Penwell et al. | |
| 2009/0109584 A1 | 4/2009 | Jones et al. | |
| 2009/0284888 A1 | 11/2009 | Bartel et al. | |
| 2009/0296430 A1 | 12/2009 | Rieux-Lopez et al. | |
| 2010/0271793 A1* | 10/2010 | Doblar | H05K 1/0271 |
| | | | 361/788 |
| 2010/0320187 A1* | 12/2010 | Griffin | H01L 23/345 |
| | | | 219/209 |
| 2011/0058324 A1* | 3/2011 | Huang | G06F 1/182 |
| | | | 361/679.4 |
| 2011/0080683 A1 | 4/2011 | Jones et al. | |
| 2011/0090633 A1* | 4/2011 | Rabinovitz | G06F 1/184 |
| | | | 361/679.31 |
| 2011/0141646 A1 | 6/2011 | Jones et al. | |
| 2011/0159727 A1 | 6/2011 | Howard et al. | |
| 2011/0279943 A1 | 11/2011 | Penwell et al. | |
| 2012/0243160 A1* | 9/2012 | Nguyen | G06F 1/181 |
| | | | 361/679.08 |
| 2013/0064506 A1* | 3/2013 | Eberle, Jr. | G02B 6/32 |
| | | | 385/49 |
| 2014/0102626 A1* | 4/2014 | Clayton | H05K 3/363 |
| | | | 156/196 |
| 2015/0002006 A1* | 1/2015 | Segroves | H05K 7/1491 |
| | | | 312/236 |
| 2015/0056865 A1* | 2/2015 | Guo | H01R 13/6658 |
| | | | 439/660 |
| 2015/0268702 A1* | 9/2015 | Huang | G06F 1/187 |
| | | | 361/679.35 |
| 2015/0351233 A1* | 12/2015 | Peterson | H05K 1/0278 |
| | | | 361/785 |
| 2016/0100497 A1* | 4/2016 | Hood | E21B 33/0385 |
| | | | 361/749 |
| 2016/0205800 A1* | 7/2016 | Roberts | H05K 7/14 |
| | | | 361/809 |
| 2017/0054175 A1* | 2/2017 | Wallace | H01M 8/065 |

FOREIGN PATENT DOCUMENTS

| | | |
|---|---|---|
| JP | 11-037400 | 2/1999 |
| JP | 2003-070156 | 3/2003 |
| JP | 2003-111270 | 4/2003 |
| KR | 10-2003-0081041 | 10/2003 |
| KR | 10-2009-0018497 | 2/2009 |
| KR | 10-1189670 | 10/2012 |
| WO | WO 95/10116 | 4/1995 |
| WO | PCT/US03/17050 ISR | 5/2003 |
| WO | WO 2011-119723 | 12/2011 |

* cited by examiner

MODULAR PROTECTION CABINET WITH FLEXIBLE BACKPLANE

CROSS-REFERENCE TO RELATED APPLICATIONS

This application claims priority to and the benefit of U.S. Provisional Application 62/196,837, titled "MODULAR PROTECTION CABINET WITH FLEX-BACK BACK PLANE," filed on Jul. 24, 2015, and the entirety of which is hereby incorporated by reference herein.

STATEMENT REGARDING GOVERNMENT RIGHTS

This invention was made with Government support under Government Contract No. W31P4Q-15-C-0022 awarded by the Department of Defense. The Government has certain rights in this invention.

BACKGROUND

1. Field

The present invention relates to a sealed enclosure for protecting electronics.

2. Description of the Related Art

Enclosures protect electronics that filter signals sent to a host electronic device. The enclosures have electronic circuit boards and wiring that connect, for example, the filter module to the host electronic device. The enclosures, however, use discrete components and gas filter tubes that require a significant amount of wiring which results in difficulty in accessing and/or reconfiguring the different components.

Typically, the electronic circuit boards that provide the connection between a filter module and a host electronic device are fixed within the enclosure. Therefore, the reconfiguration of the enclosure to add another filter module or switch to a different type of filter module may require significant rewiring and configuration changes to the circuitry. Moreover, when a filter module is inserted into the enclosure, the filter module may not directly align with the electronic circuit board within the enclosure.

SUMMARY

In general one aspect of the subject matter described in this specification is embodied in an enclosure for protecting electronic devices. The enclosure includes a rear base defining a cavity for holding one or more electronic devices. The enclosure includes a front cover coupled to the rear base and movable between an open position and a closed position. The enclosure includes a chassis mounted within the cavity of the rear base and a drawer chest having a multiple drawers within the cavity of the rear base. The drawer chest is connected to the chassis, and the multiple drawers are configured to receive the one or more electronic devices. The enclosure includes one or more connectors that are exposed outward and provide a connection to a host electronic device.

These and other embodiments may include one or more of the following features. The front cover and the rear base may be connected using a hinge. The hinge may have a pin which may allow the front cover to be uncoupled from the rear base when the pin is removed. The rear base of the enclosure may have a rear surface which may have a recessed portion. The one or more connectors may be exposed outward from the recessed portion.

The enclosure may have a side mount for additional electronic devices to be mounted to the side surface of the rear base. The enclosure may have a rain cover to protect the additional electronic device when the rain cover is closed and a mounting plate to connect the rain cover to the side surface.

The enclosure may have one or more connectors connected to a rear surface of the rear base. The one or more connectors may have a first end exposed within the cavity and a second end exposed outward from the rear surface. The enclosure may have a flex backplane that has one or more printed circuit boards and one or more cables that connect the one or more connectors to the one or more printed circuit boards. The one or more cables may be routed along one or more paths. A flexible harness may electrically connect an inserted electronic device to at least one of the one or more connectors.

The one or more electronic devices may include one or more interchangeable transient protection modules. The one or more interchangeable transient protection modules may include two to eight wire signal protection modules. The different signal types being protected may include analog, digital, loudspeaker, T1/E1, Digital Subscriber Line (DSL), Ethernet, Power over Ethernet (PoE) or various others.

Each drawer of the multiple drawers may define a cavity that holds an electronic device. The drawer may have two rail interfaces on opposite sides to receive a rail of the electronic device.

The enclosure may include a first slide plate connected to a back end of the drawer chest and a flex backplane connected to the first slide plate. The enclosure may include a second slide plate connected to the flex backplane and a backplane support for guiding cables to the one or more connectors. The flex backplane may have one or more printed circuit boards that connect to the one or more electronic devices when the one or more electronic devices are inserted into a drawer. The one or more printed circuit boards may have one or more connector lobes. Each connector lobe of the one or more connector lobes may be located at an end of a respective drawer and have one or more self-aligning connectors. Each connector lobe may float around a central longitudinal axis of the drawer so that the one or more self-aligning connectors align with one or more connectors of an electronic device when the electronic device is inserted into the drawer. The enclosure may have a door stay connected to the front cover and an interior surface of the rear base. The door stay may prop the front cover open when in the open position.

In another aspect, the subject matter is embodied in a flexible backplane for interfacing with electronic devices. The flexible backplane includes one or more printed circuit boards. A respective printed circuit board of the one or more printed circuit boards has one or more connectors and a connector lobe. The flexible backplane includes a flexible accordion attachment connected to the connector lobe and configured to allow the connector lobe to float or move in a plurality of directions.

In another aspect, the subject matter is embodied in an electronic device enclosure system for filtering signals. The electronic device enclosure system includes an enclosure. The enclosure includes a rear base defining a cavity and a front cover coupled to the rear base and movable between an open position and a closed position. The enclosure includes a chassis mounted within the cavity of the rear base and a drawer chest having multiple drawers within the cavity. The electronic device enclosure system includes multiple interchangeable transient protection modules being inserted into the cavity of the rear base. Each respective transient protection module being inserted into a respective drawer of the plurality of drawers.

BRIEF DESCRIPTION OF THE DRAWINGS

Other systems, methods, features, and advantages of the present invention will be or will become apparent to one with skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

Disclosed herein are enclosures and systems for carrying, interfacing and connecting one or more signal modules to a host electronic device. Particular embodiments of the subject matter described in this specification may be implemented to realize one or more of the following advantages. An enclosure, such as a Ground Communication Filter Unit (GCFU), is able to connect to a host electronic device and provide an interface between the host electronic device and another electronic device, such as a filter module. The enclosure provides a modular design that allows for interchangeability among different types of electronic devices, such as different types of transient protection modules (TPMs) or filter modules. By having a modular design, the enclosure is reconfigurable without interruption to the operation of the other inserted electronic devices. That is, the enclosure may be reconfigured to receive any number of electronic devices and/or different types of electronic devices. The modular design allows easy reconfiguration of the number and types of stored electronic devices.

The electronic devices may be arranged in any number of configurations, e.g., vertically and/or horizontally, within the enclosure. For example, TPMs may be arranged in any number of rows and/or columns. The flexibility allows for the number and arrangement of the electronic devices to be configured and reconfigured depending on the task. For example, a first task may require use of four analog filters. Upon completion of the first task, the enclosure may be easily reconfigured to support a second task requiring the use of four digital filters instead of the four analog filters without having to rewire the enclosure. Thus, the enclosure saves time and provides interoperability to perform different tasks that require different electronic devices.

Other benefits and advantages may include the capability to connect to electronic devices that are mis-aligned. For example, if a connector of an electronic device does not align with the connectors on the printed circuit boards within the enclosure, the connectors on the printed circuit board may float about an axis to electrically connect with the electronic device. Moreover, aspects of the enclosure reduce wiring error within the enclosure and provide a connection to the external input/output interface. Thus, the enclosure assists in maintaining signal connectivity between an electronic device and the host electronic device.

Additionally, the modularity of the electronic devices allows for easier removal and maintenance of the electronic devices for repair. Thus, service costs and time are reduced.

Figure 1:
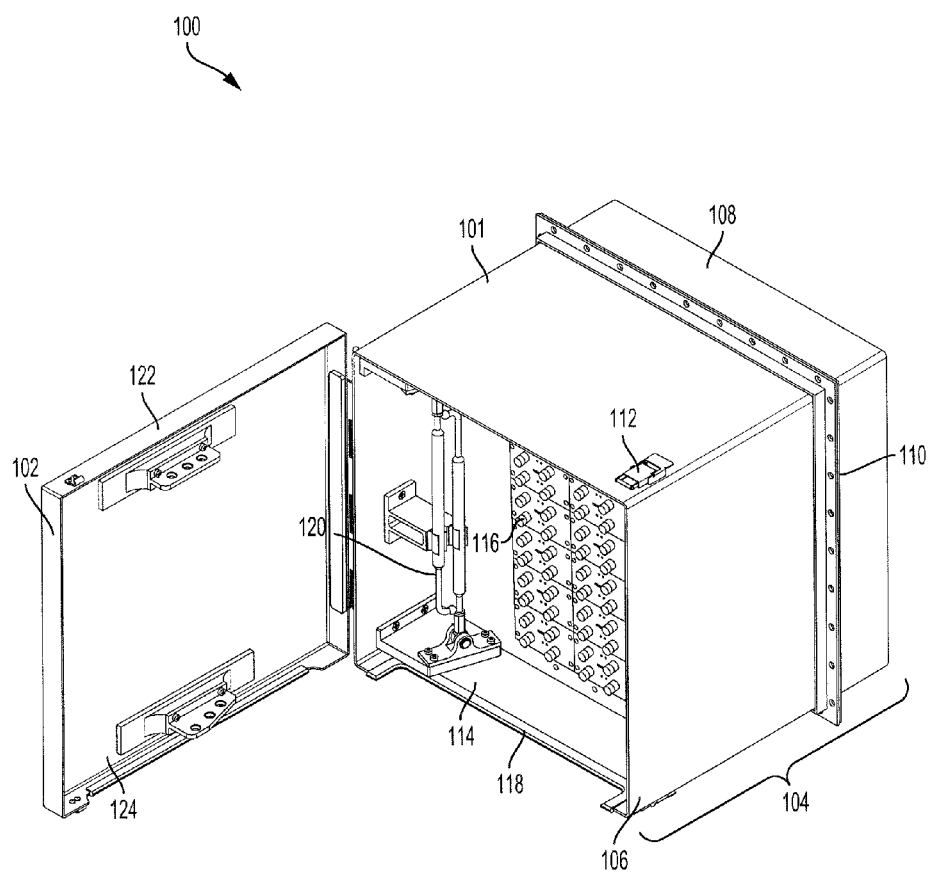
FIG. 1 is a front view of an enclosure system for providing signal filtering according to an aspect of the invention.

FIG. 1 is a front view of an enclosure system for providing signal filtering. The enclosure system 100 includes an enclosure 101 that holds and protects one or more electronic devices 116. The enclosure 101 provides an interface between the one or more electronic devices 116 and a host electronic device. The enclosure 101 may be mounted onto the host electronic device, wall or other surface.

The enclosure 101 protects the one or more electronic devices 116 from shock, dust, dirt, weather, water, heat and other environmental conditions or damage. The enclosure 101 may meet or exceed one or more governmental requirements to withstand environmental conditions, such as vibration, shock or stress thresholds. The enclosure 101 may have physical dimensions of approximately 16.5 inches by 18 inches by 18 inches, and the exposed surfaces of the enclosure 101 may be coated with a non-reflective coating.

The one or more electronic devices 116 that are inserted into the enclosure 101 may be one or more signal modules and/or one or more filter modules, e.g., one or more transient protection modules (TPMs). The one or more transient protection modules protect different signal types. The different signal types being protected may include analog, digital, loudspeaker, T1/E1, Digital Subscriber Line (DSL), Ethernet, Power over Ethernet (PoE) or various others. The TPMs that are stored and protected in the enclosure 101 are described in U.S. Pat. No. 9,190,837, which is hereby incorporated by reference herein.

The enclosure 101 has a front cover 102 and a rear base 104. The front cover 102 may define an internal cavity 124. The front cover 102 may have a wind stop to protect the enclosure 101 from the wind. The rear base 104 may define an internal cavity 114. The one or more electronic devices 116 are held within the internal cavities 114, 124 of the enclosure 101.

The front cover 102 is movable between an open position and a closed position. The front cover 102 may have a lip 122 that covers the outer perimeter edge of the rear base 104 when the front cover 102 is in the closed position. The rear base 104 and/or front cover 102 may have a gasket 118 that runs along the outer perimeter edge such that when the front cover 102 is in the closed position incoming cabling is protected from abrasion.

The enclosure 101 may have one or more latches 112. The latch 112 may snap or latch onto the front cover 102 when the front cover 102 is in the closed position to secure the front cover 102 to the rear base 104. The enclosure 101 may have a door stay 120. The door stay 120 may be connected to an inner surface of the rear base 104 and an inner surface of the front cover 102. The door stay 120 may be configured to prop the front cover 102 in the open position. The door stay 120 may be a door-biasing mechanism. That is, the door stay 120 may have a locked position and an unlocked position, such that when the door stay 120 is in the locked position and the front cover 102 is in the open position, the door stay 120 props the front cover 102 open. But, when the front cover 102 is open and the door stay 120 is in the unlocked position, the front cover 102 may be moved into the closed position.

The rear base 104 may segregate the internal cavity 114 into an electrically dirty portion 106 and an electrically clean portion 108. The dirty portion 106 may be an area susceptible to electro-magnetic interference (EMI) and/or electro-magnetic conductance (EMC). The clean portion 108 may be an area protected against EMI and/or EMC. The clean portion 108 may house an inserted electronic device, such as a TPM. The inner surface of the clean portion 108 may have an anodized coating, chromate conversion coating, or other protective (and preferably conductive) coating.

The rear base 104 may segregate the internal cavity 114 into the two portions using a dividing wall. The mounting flange 110 forms an annular ring around the enclosure 101 that seals out EMI/EMC from the host electronic device. The mounting flange 110 may have a gasket on the back side toward the host electronic device, i.e., the side toward the clean portion 108. The mounting flange 110 may be used to mount the enclosure 101 to the host electronic device.

Figure 2:
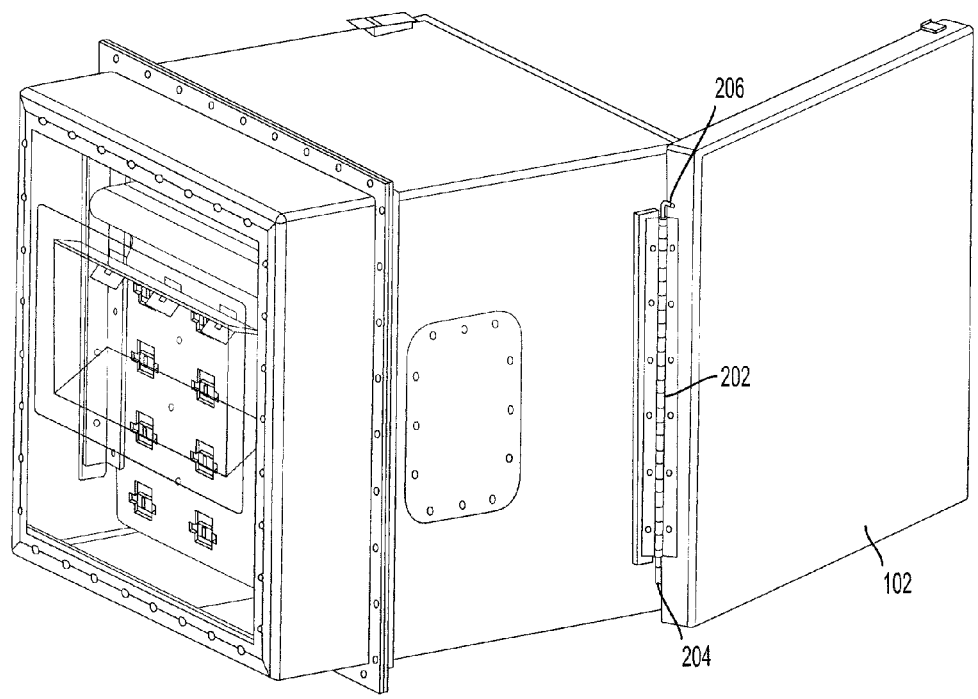
FIG. 2 is a side view of the enclosure of FIG. 1 according to an aspect of the invention.

FIG. 2 is a side view of the enclosure 101. The front cover 102 may use a securing mechanism, such as a hinge 202, to swing between the open position and the closed position and secure the front cover 102 to the rear base 104. The securing mechanism may include the hinge 202 and a pin 204. The hinge 202 may be fastened to the front cover 102 and the rear base 104 and interconnect to secure the front cover 102 with the side surface of the rear base 104 when the pin 204 is inserted.

The hinge 202 may run vertically along a longitudinal axis that extends from a point near a top surface of the enclosure 101 to a point near the bottom surface of the enclosure 101. The hinge 202 extends along a portion of the perimeter of the outer surface of the front cover 102 and a portion of the outer side surface of the rear base 104. The hinge 202 has a central through-hole that extends along the longitudinal axis and receives the pin 204. In some implementations, the hinge 202 may run horizontally from a point near a side surface of the enclosure 101 to a point near an opposite side surface of the enclosure 101 on either the top surface of the enclosure 101 or the bottom surface of the enclosure 101 to open in a vertical direction.

The pin 204 has a top end and a bottom end. The top end of the pin 204 may have a service handle 206 that allows a user to lift and remove the pin 204 and guide the pin 204 through the through-hole of the hinge 202. A hairpin cotter pin, e-clip, or key ring at the bottom end of the pin 204 may secure the pin 204 within the hinge 202. The pin 204 secures the front cover 102 to the rear base 104 when inserted. When the pin 204 is removed, the front cover 102 is removable from the rear base 104.

Figure 3:
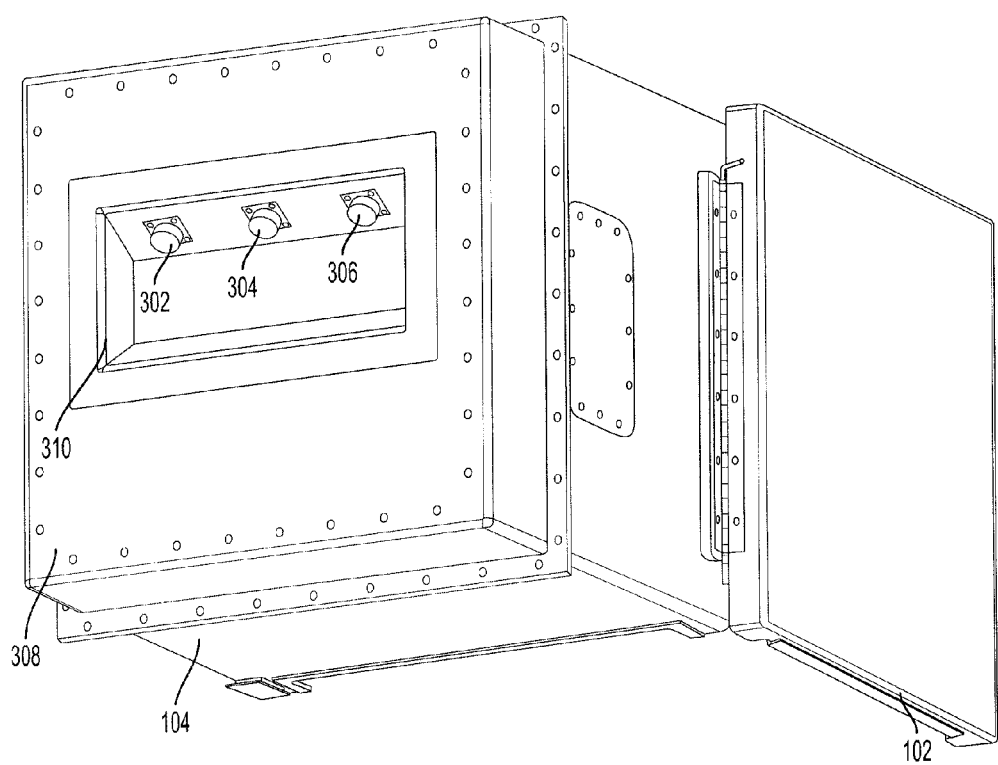
FIG. 3 is a rear view of the enclosure of FIG. 1 according to an aspect of the invention.

FIG. 3 is a rear view of the enclosure 101. The rear base 104 has a rear surface 308. The rear surface has a recessed region 310. One or more input/output connectors, e.g., input/output connectors 302, 304, and 306, extend from within the cavity 114 of the rear base 104 outward through the rear surface 308 so that the one or more input/output connectors 302, 304 and 306 are exposed outward from the rear surface 308. The one or more input/output connectors 302, 304 and 306 may connect to the host electronic device and allow a signal inputted through the one or more electronic devices 116 to pass or filter through to the host electronic device.

Figure 4:
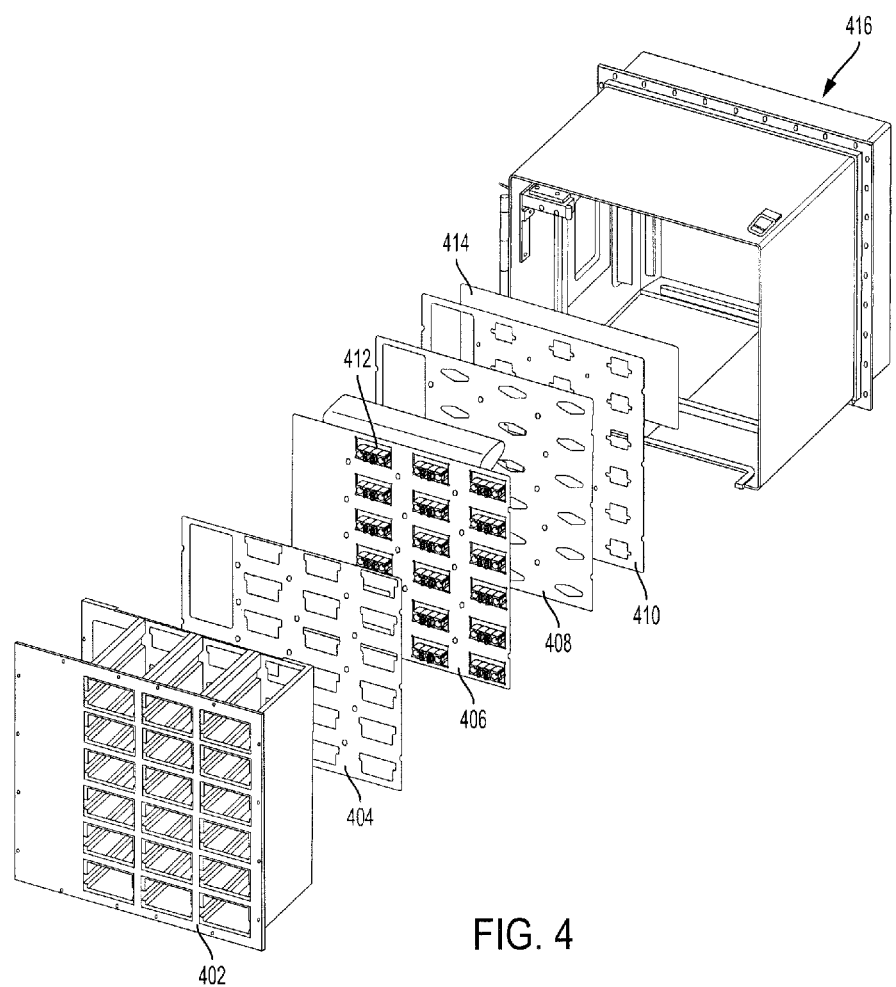
FIG. 4 is an exploded view of the interior of the enclosure of FIG. 1 according to an aspect of the invention.

FIG. 4 is an exploded view of the interior of the enclosure 101. The interior of the enclosure 101 includes a drawer chest 402 and a chassis 416. The chassis 416 and the drawer chest 402 may be brazed using an aluminum brazing process to provide EMI protection. The chassis 416 may have a first slide plate 404, a flex backplane 406 with one or more floating printed circuit boards 412 attached via flex harnesses and located within it, a second slide plate 408, a backplane support 410 and/or a cover 414. The enclosure 101, the drawer chest 402, and the backplane support 410 may be made of aluminum or other metal. The slide plates 404, 408 are non-metal, such as Delrin® (acetal) or Teflon® (Polytetrafluoroethylene or PTFE). In some implementations, the enclosure 101 has a monolithic backplane and instead of the slide plates 404, 408, has only a backplane support 410. In this configuration, the backplane support 410 would be non-metal, such as Delrin® (acetal) or Teflon® (PTFE).

The drawer chest 402 is further described below in reference to FIG. 5. The first slide plate 404 may be connected to a back end of the drawer chest 402. The flex backplane 406 may be connected to and in between the first slide plate 404 and the second slide plate 408. The second slide plate 408 may be connected to the backplane support 410.

Figure 16:
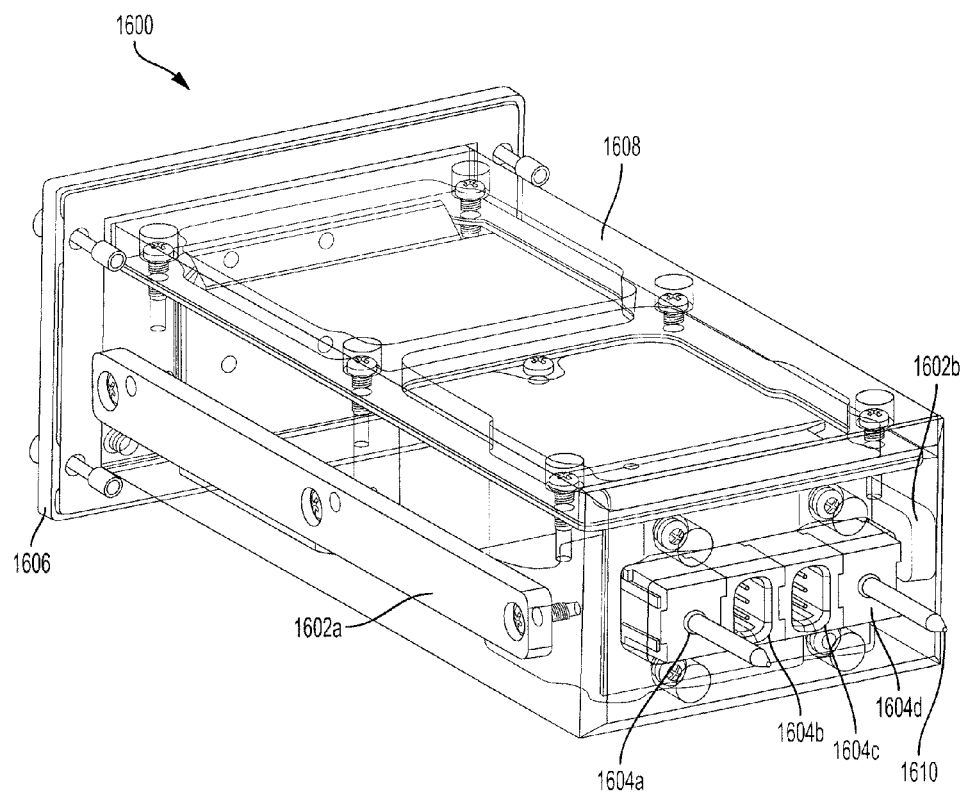
FIG. 16 is a rear view of a transient protection module according to an embodiment of the present invention.

The flex backplane 406 may have one or more printed circuit boards 412 that connect to one or more connectors of at least one of the one or more electronic devices 116, such as connectors 1604a-d of the transient protection module 1600 as shown in FIG. 16, when the at least one of the one or more electronic devices 116 is inserted into one of the drawers 502. At least one of the first slide plate 404, the second slide plate 408, the backplane support 410 or the flex backplane 406 may be configured to allow one or more printed circuit boards 412 to float. That is, if the one or more connectors on the printed circuit boards 412 are mis-aligned with the one or more connectors on a corresponding electronic device 116 the one or more connectors on the printed circuit boards 412 may be able to move or angle to maintain or establish the connection with the connectors on the corresponding electronic device 116.

Different types of the one or more electronic devices 116 may connect to the one or more printed circuit boards 412. For example, any of the different types of TPMs including a 4-post analog transient protection module 1100, a loudspeaker 2-post transient protection module 1200, a 4-post digital transient protection module 1300, a T1/E1 transient protection module 1400, or an Ethernet transient protection module 1500, as shown in FIGS. 11-15 respectively, may connect to the one or more printed circuit boards 412. The enclosure 101 may receive any one of the different types of the one or more electronic devices 116 in one of the multiple drawers 502 to connect to one of the one or more printed circuit boards 412.

Figure 8:
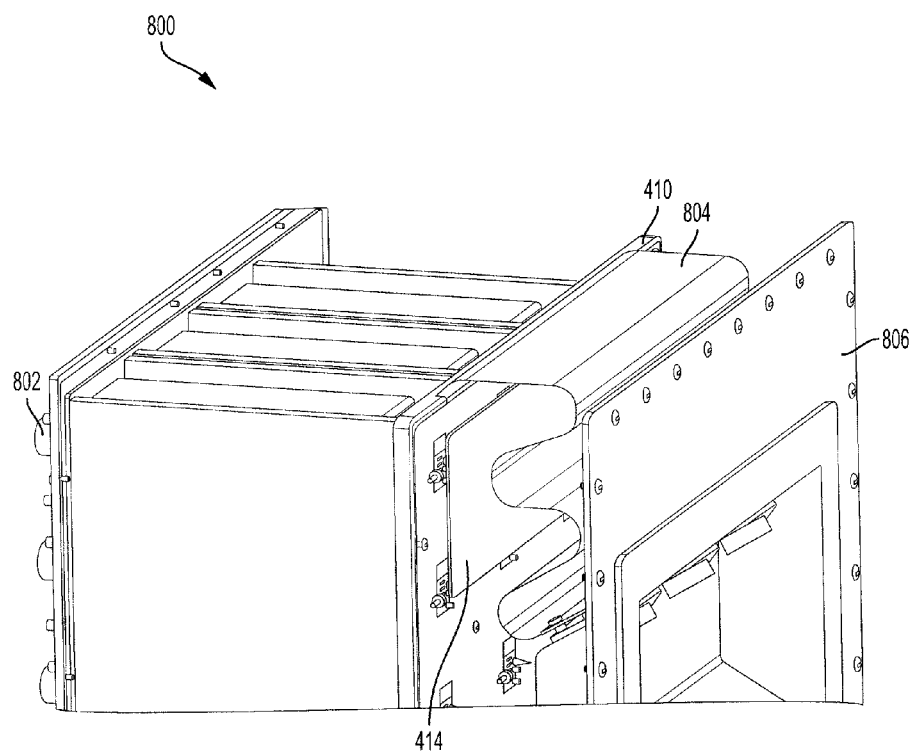
FIG. 8 is an interior view of the enclosure of FIG. 1 showing an interconnection of the signal devices to the input/output connectors according to an aspect of the invention.

A cover 414 may connect in between the backplane support 410 and a flex harness 804, as shown in FIG. 8. The cover 414 may protect one or more module guide pins that stick through the backplane support 410 from rubbing against the flex harness 804.

Figure 5:
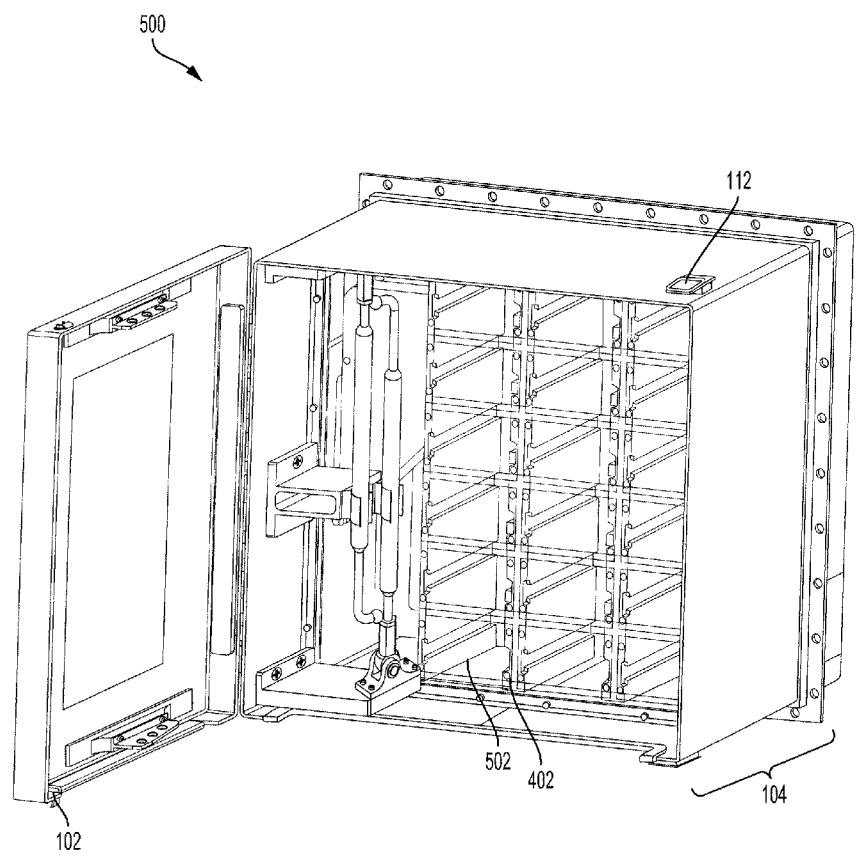
FIG. 5 is an inside view of the front of the enclosure of FIG. 1 according to an aspect of the invention.

FIG. 5 is an inside view of the front of the enclosure 101 with the front cover 102 open. A drawer chest 402 is inside the enclosure 101 and within the cavity 114. The drawer chest 402 has multiple drawers 502. The drawer chest 402 may arrange the multiple drawers 502 in any number of rows and/or columns in any number of configurations. For example, the enclosure 101 has 6 rows and 3 columns of drawers for a total of 18 drawers. Any number of the one or more electronic devices 116 may be placed in the drawers 502 in any configuration depending on the application and/or host electronic device. If no electronic device is inserted into an empty drawer, a cover plate would need to be installed in that position. For example, a first set of electronic devices may be inserted into the first column of drawers 502. The first set may then be removed and a second set of electronic devices may be inserted in the third row of drawers 502. The modularity of the electronic devices 116 provides flexibility in adding, removing and/or reconfiguring the placement of the electronic devices 116 which allows easy access to the electronic devices 116 and simplifies configuration of the electronic devices 116 for different applications.

The multiple drawers 502 have a cavity that extends along an axis from an opening of the cavity 114 to the rear of the rear base 104. The cavity of the multiple drawers 502 receives the one or more electronic devices 116. The multiple drawers 502 may receive different types of the one or more electronic devices 116. For example, any of the different types of TPMs may be received within one of the multiple drawers 502 of the drawer chest 402.

Figure 6:
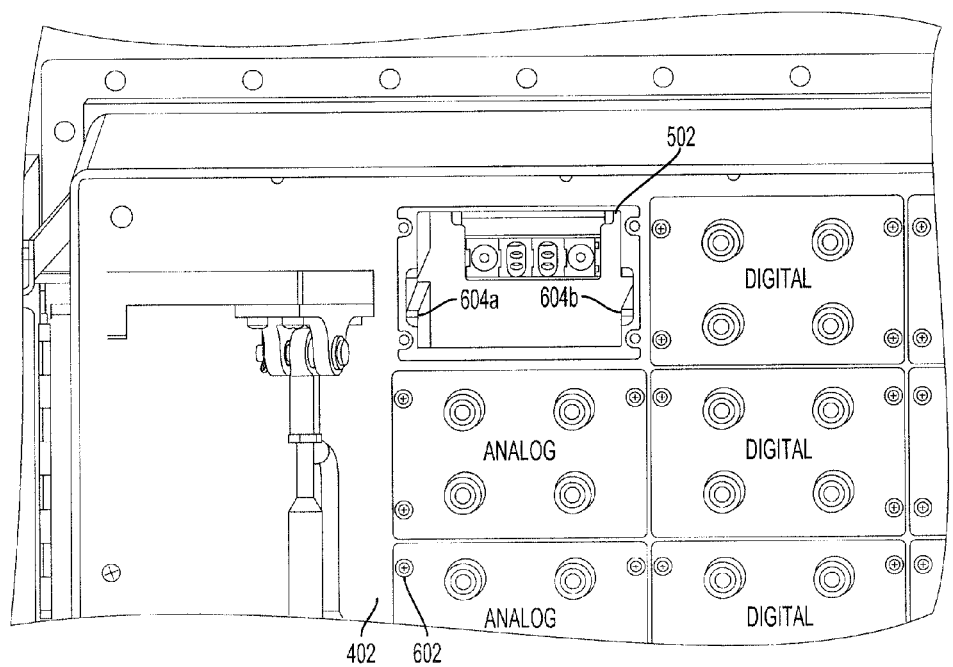
FIG. 6 is an exploded view of the drawers of the drawer chest of the enclosure of FIG. 1 according to an aspect of the invention.

Each of the drawers 502 may have a sliding mechanism to receive an electronic device. The sliding mechanism may be two rail interfaces, e.g., rail interfaces 604*a-b* of FIG. 6, that are on opposite sides of each of the drawers 502. The rail interfaces 604*a-b* may receive the rails 1602*a-b* of the transient protection module 1600, as shown in FIG. 16, when the transient protection module 1600 is inserted into one of the drawers 502. Each of the drawers 502 may have EMI Shielding surrounding the opening of the drawer to maintain the EM barrier of the enclosure, and may be mounted to the drawer chest 402 using one or more fasteners 602, such as a screw.

Figure 7:
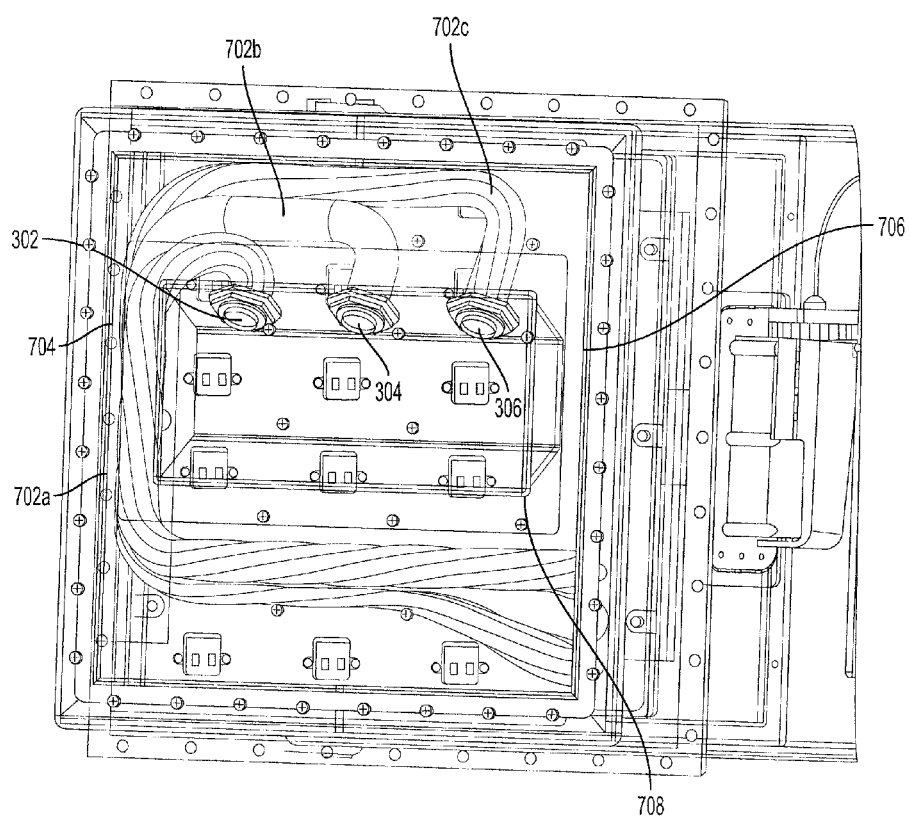
FIG. 7 is an interior view of the rear portion according to an aspect of the invention.

FIG. 7 is an interior view of the rear portion of the enclosure 101. The rear portion has the one or more input/output connectors 302, 304 and 306 that are exposed outward of the rear surface 308. The one or more input/output connectors 302, 304 and 306 are housed within the rear base 104 and are exposed from the enclosure 101 from the recessed region 708. Wires from the one or more printed circuit boards 412 may be bundled behind the backplane support 410 into one or more cables 702*a-c* to connect to the one or more input/output connectors 302, 304 and 306. The one or more cables 702*a-c* may be routed along one or more cable paths, such as the cable paths 704 and 706. The one or more input/output connectors 302, 304 and 306 may connect to the host electronic device, for example, when the enclosure 101 is mounted onto the host electronic device.

In some implementations, the one or more printed circuit boards 412 are connected to the one or more input/output connectors 302, 304 and 306 through a flex harness 804, as shown in FIG. 8. The flex harness 804 connects to the input/output connectors 302, 304 and 306 to provide external input/output. The flex harness 804 reduces the potential for wiring error within the enclosure 101.

Figure 9:
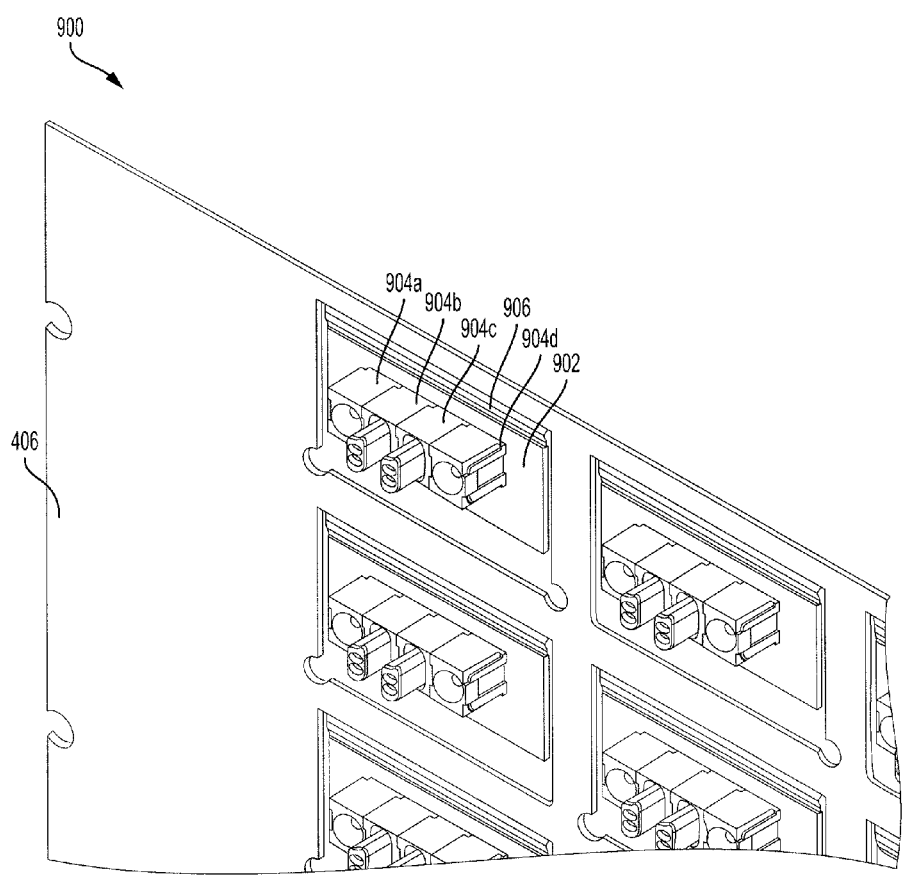
FIG. 9 is an exploded view of the one or more printed circuit boards according to an aspect of the invention.

FIG. 9 is an exploded view of the one or more printed circuit boards 412. The one or more printed circuit boards 412 on the flex backplane 406 may include one or more connectors 904*a-d*. The one or more connectors 904*a-d* may be self-aligning. The one or more connectors 904*a-d* may be female connectors, male connectors or a combination of both. The one or more connectors 904*a*-904*d* are configured to receive and/or insert into a corresponding connector of an inserted electronic device 116. The one or more connectors 904*a-d* may receive a corresponding connector of multiple different types of electronic devices 116. The different types of electronic devices 116 may be interchangeable with each other. For example, a first electronic device, such as a four-post analog transient protection module, may be inserted and connected to a printed circuit board. The first electronic device may then be removed and a second electronic device, such as a T1/E1 transient protection module, may be inserted and connected to the same printed circuit board.

The one or more connectors 904*a-d* may be mounted on a connector lobe 902. The connector lobe 902 may be connected to a flexible accordion attachment 904. The flexible accordion attachment 904 may attach to the flex backplane 406. The slide plates 404, 408 and the flexible accordion attachment 904 may allow the printed circuit board 412 to float or move vertically and/or horizontally so that the one or more connectors 904*a-d* may self-align and minimize the stress with one or more mis-aligned connectors of an inserted electronic device 116.

Figure 10:
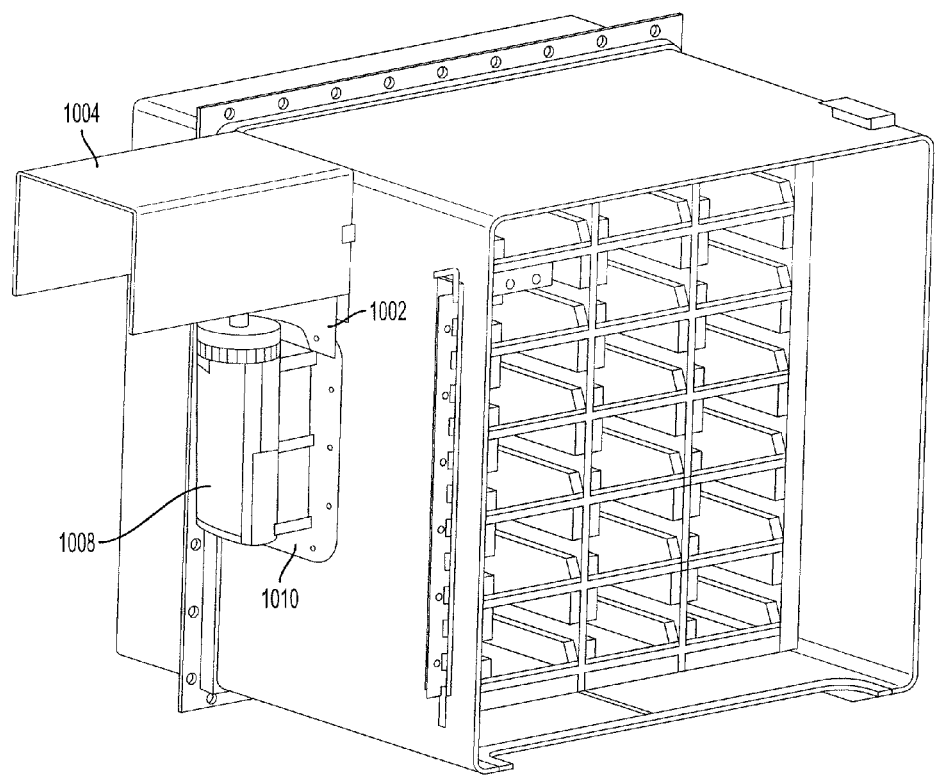
FIG. 10 is a side view of the enclosure showing an additional connector according to an aspect of the invention.
Figure 11:
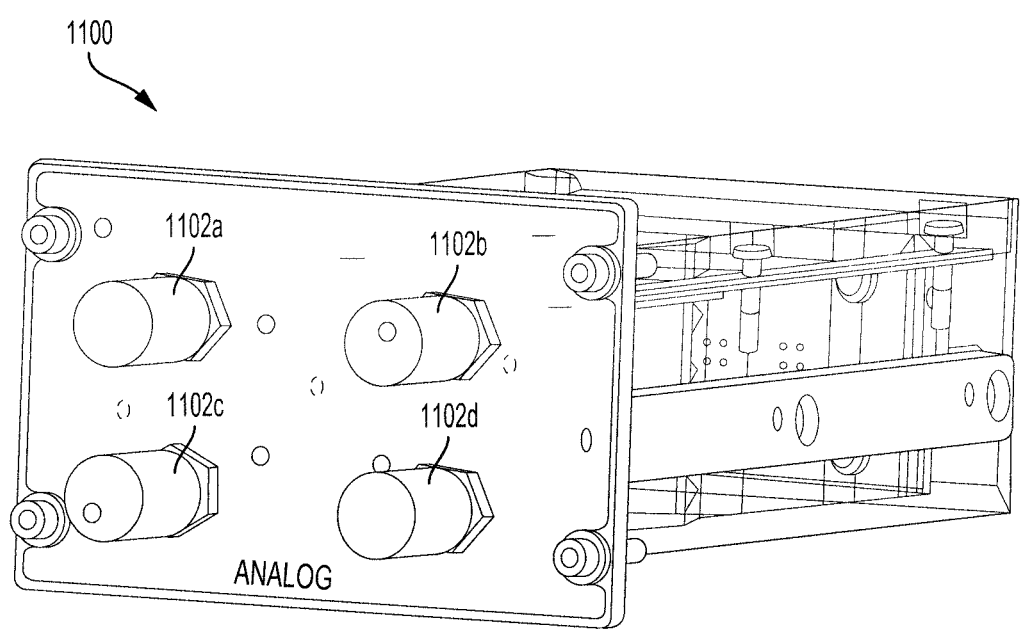
FIG. 11 is an illustration of a four-post analog transient protection module according to an aspect of the invention.
Figure 12:
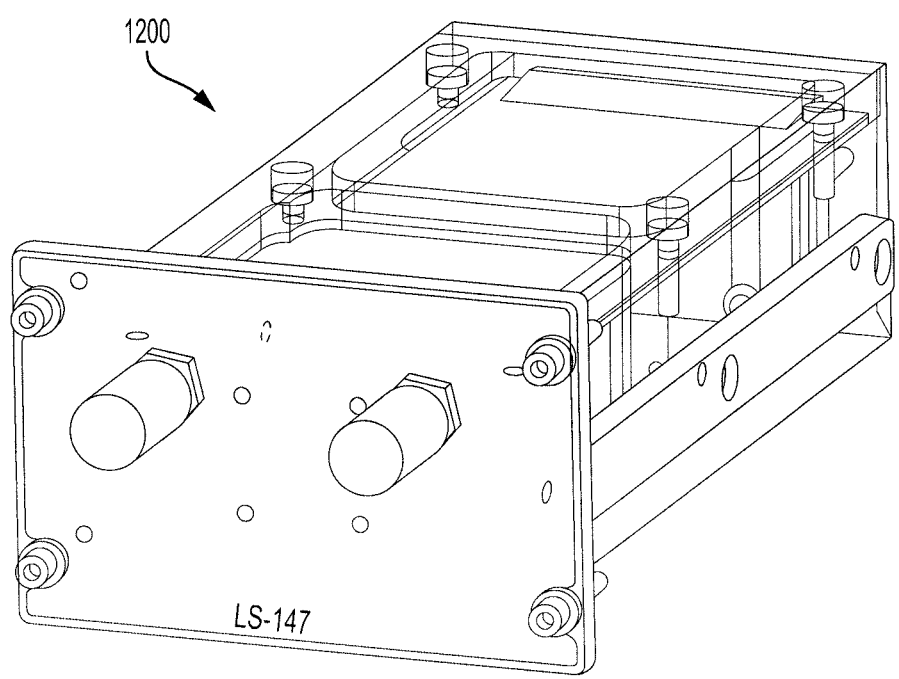
FIG. 12 is an illustration of a loudspeaker two-post transient protection module according to an aspect of the invention.
Figure 13:
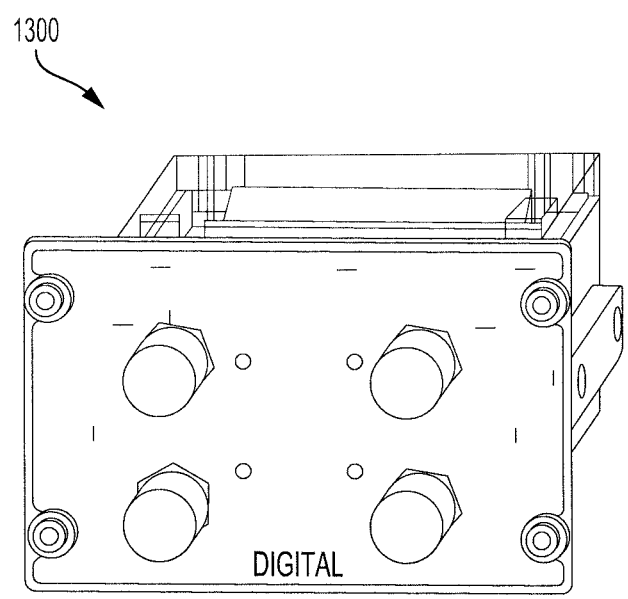
FIG. 13 is an illustration of a four-post digital transient protection module according to an aspect of the invention.
Figure 14:
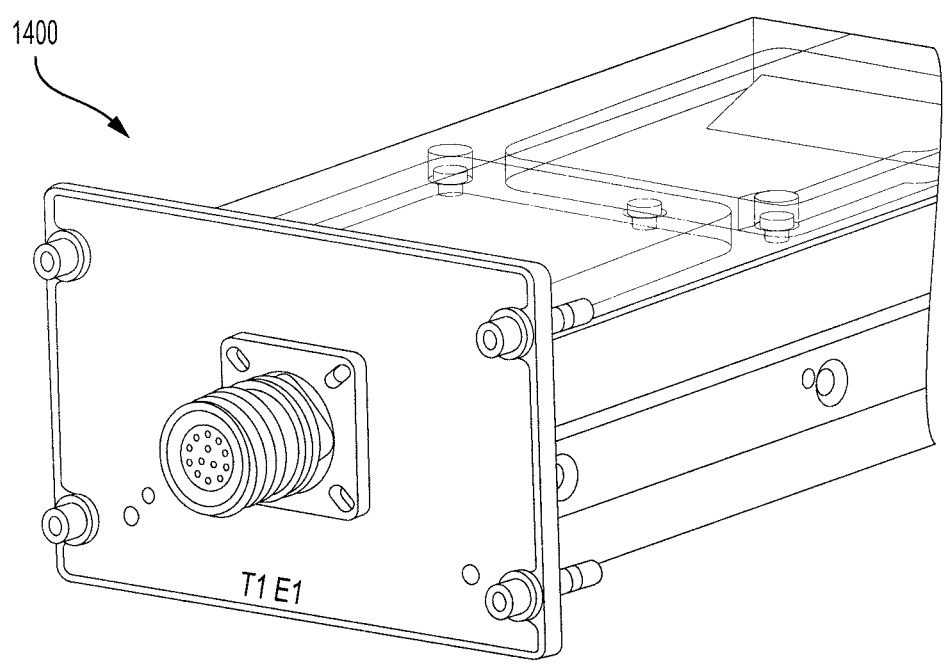
FIG. 14 is an illustration of a T1/E1 transient protection module according to an aspect of the invention.
Figure 15:
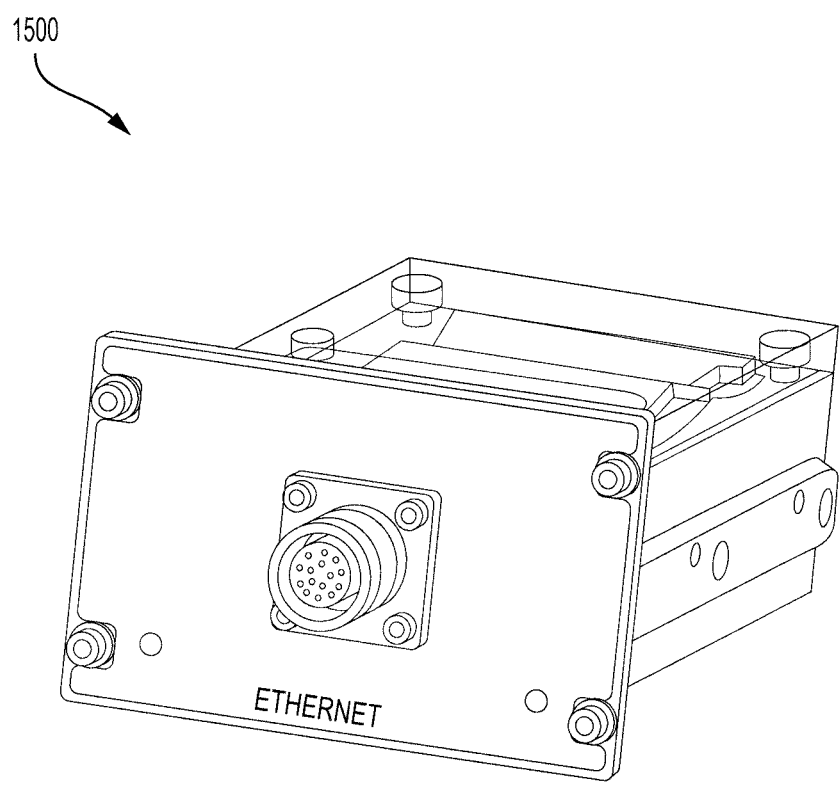
FIG. 15 is an illustration of an Ethernet transient protection module according to an aspect of the invention.

FIG. 10 is a side view of the enclosure 101 showing an additional filter module 1008. The enclosure 101 may have a side mount 1010 that is mounted on a side surface of the rear base 104. The additional filter module 1008 may be mounted using the side mount 1010. In some implementations, a rain cover 1004 is mounted to a mounting plate 1002 that is connected to the side mount 1010. The rain cover 1004 may be movable between a raised position (as shown) and a lowered position. When in the lowered position, the rain cover 1004 encloses the additional filter module 1008 and protects the additional filter module 1008 from rain ingress and/or other environmental conditions.

FIG. 16 is a rear view of a transient protection module 1600. The transient protection module 1600 has a housing 1608, a front panel 1606, and one or more connectors 1604. The housing 1608 may have a lid and may be made of aluminum. The front panel 1606 may have one or more binding posts, e.g., binding posts 1102*a-d* of FIG. 11. The binding posts may connect to a source signal that is to be filtered and may be surrounded with an insulator. The transient protection module 1600 may have multiple guide rails, e.g., rails 1602*a-b*, positioned on opposite sides of the transient protection module 1600. The rails 1602*a-b* may interface and slide into the one or more rail interfaces 604*a-b* of a drawer 502. The one or more connectors 1604*a-d* of the TPM 1600 may engage the one or more connectors 904*a-d* of the one or more printed circuit boards 412. The one or more connectors 1604*a-d* may have a pin 1610 that engages the one or more connectors 904*a-d* to guide and align the connector on the TPM with the connectors on the printed circuit boards 412 before the electrical contacts meet.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. An enclosure for protecting electronic devices, comprising:
    a rear base defining a cavity for holding one or more electronic devices;
    a front cover coupled to the rear base and movable between an open position and a closed position;
    a chassis mounted within the cavity of the rear base;
    a backplane having a printed circuit board with one or more movable connectors that are configured to angle when a pin of the one or more electronic devices is mis-aligned with and engages the one or more movable connectors;
    a drawer chest having a plurality of drawers within the cavity of the rear base and connected to the chassis, the plurality of drawers configured to receive the one or more electronic devices; and
    one or more connectors that are exposed outward and provide a connection to a host electronic device.

2. The enclosure of claim 1, wherein the front cover and the rear base are connected via a hinge having a pin, wherein the hinge allows the front cover to be uncoupled from the rear base when the pin is removed from the hinge.

3. The enclosure of claim 1, wherein the rear base has a rear surface and the rear surface has a recessed portion.

4. The enclosure of claim 3, wherein the one or more connectors are exposed outward from the recessed portion.

5. The enclosure of claim 4, further comprising:
    a side mount for an additional electronic device to be mounted to a side surface of the rear base;
    a rain cover for protecting the additional electronic device when closed; and
    a mounting plate to connect the rain cover to the side surface of the rear base.

6. The enclosure of claim 1,
    wherein the one or more connectors are connected to a rear surface of the rear base, wherein each connector of the one or more connectors has a first end exposed within the cavity and a second end exposed outward from the rear surface.

7. The enclosure of claim 6, further comprising:
    one or more cables that electrically connect the one or more connectors to the printed circuit board, wherein the one or more cables are routed along one or more paths.

8. The enclosure of claim 7, further comprising a flexible harness that electrically connects an inserted electronic device to at least one of the one or more connectors.

9. The enclosure of claim 1, wherein the one or more electronic devices include one or more two to eight wire interchangeable transient protection modules that protect various signal types.

10. The enclosure of claim 1, wherein each drawer of the plurality of drawers defines a cavity configured to hold an electronic device of the one or more electronic devices and has two rail interfaces on opposites sides of the drawer to each receive a rail of the electronic device.

11. The enclosure of claim 1, further comprising:
    a first slide plate connected to a back end of the drawer chest;
    a second slide plate connected to the backplane; and
    a backplane support for guiding cables to the one or more exposed connectors, wherein the backplane is a flexible backplane and is connected to the first slide plate.

12. The enclosure of claim 11, wherein the printed circuit board connects to the one or more electronic devices when the one or more electronic devices are inserted into at least one of the plurality of drawers.

13. The enclosure of claim 12, wherein the printed circuit board has a connector lobe that is located at an end of a respective drawer of the plurality of drawers and that is connected with the one or more movable connectors, wherein the connector lobe is configured to float around a central longitudinal axis of the respective drawer so that the one or more movable connectors align with the pin of the one or more electronic devices.

14. The enclosure of claim 1, further comprising:
    a door stay connected to the front cover and an interior surface of the rear base, wherein the door stay is configured to prop the front cover open when in the open position.

15. The enclosure of claim 1, wherein the printed circuit board has one or more movable connectors and a connector lobe, wherein the one or more movable connectors connect to the connector lobe.

16. The enclosure of claim 15, further comprising:
    a flexible accordion attachment connected to the connector lobe and configured to allow the connector lobe to float or move in a plurality of directions.

17. The enclosure of claim 16, wherein the flexible accordion attachment is configured to allow the connector lobe to float or move in a vertical direction and a horizontal direction so that the one or more movable connectors on the connector lobe self-align with the pin of an inserted electronic device.

18. An enclosure system for filtering signals, comprising:
    an enclosure having:
        a rear base defining a cavity,
        a front cover coupled to the rear base and movable between an open position and a closed position,
        a chassis mounted within the cavity of the rear base,
        a backplane with a printed circuit board, and
        a drawer chest having a plurality of drawers within the cavity of the rear base; and
    a first interchangeable transient protection module or a second interchangeable transient protection module inserted into a respective drawer of the plurality of drawers, the printed circuit board being configurable to connect to the first interchangeable transient protection module when the first interchangeable transient protection module is inserted and the second interchangeable transient protection module when the second interchangeable transient protection module is inserted, the first transient protection module being of a different type than the second transient protection module.

19. The enclosure system of claim 18, wherein the enclosure system is reconfigured by a method comprising:
   inserting the first interchangeable transient protection module into the respective drawer;
   removing the first interchangeable transient protection module from the respective drawer; and
   inserting the second interchangeable transient protection module into the respective drawer.

20. An enclosure for protecting electronic devices, comprising:
   a rear base defining a cavity for holding one or more electronic devices;
   a front cover coupled to the rear base and movable between an open position and a closed position;
   a chassis mounted within the cavity of the rear base;
   a drawer chest having a plurality of drawers within the cavity of the rear base and connected to the chassis, the plurality of drawers configured to receive the one or more electronic devices;
   one or more connectors that are exposed outward and provide a connection to a host electronic device;
   a first slide plate connected to a back end of the drawer chest;
   a flex backplane connected to the first slide plate;
   a second slide plate connected to the flex backplane; and
   a backplane support for guiding cables to the one or more exposed connectors.

* * * * *